United States Patent
Healy et al.

(10) Patent No.: US 10,019,312 B2
(45) Date of Patent: *Jul. 10, 2018

(54) ERROR MONITORING OF A MEMORY DEVICE CONTAINING EMBEDDED ERROR CORRECTION

(71) Applicant: International Business Machines Corporation, Armonk, NY (US)

(72) Inventors: Michael B. Healy, Cortlandt Manor, NY (US); Hillery C. Hunter, Chappaqua, NY (US); Charles A. Kilmer, Essex Junction, VT (US); Kyu-hyoun Kim, Chappaqua, NY (US); Warren E. Maule, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 94 days.

This patent is subject to a terminal disclaimer.

(21) Appl. No.: 15/583,019

(22) Filed: May 1, 2017

(65) Prior Publication Data
US 2017/0235632 A1    Aug. 17, 2017

Related U.S. Application Data

(63) Continuation of application No. 15/401,744, filed on Jan. 9, 2017, which is a continuation of application (Continued)

(51) Int. Cl.
*G06F 11/10*    (2006.01)
*G06F 3/06*     (2006.01)
(Continued)

(52) U.S. Cl.
CPC ..... *G06F 11/1044* (2013.01); *H03M 13/1515* (2013.01); *H03M 13/19* (2013.01)

(58) Field of Classification Search
CPC ............ G06F 11/1004; G06F 11/0766; G06F 11/1008; G06F 11/1024; G06F 3/0619;
(Continued)

(56) References Cited

U.S. PATENT DOCUMENTS

| | | |
|---|---|---|
| 4,964,130 A | 10/1990 | Bowden, III et al. |
| 5,881,072 A | 3/1999 | Dell |

(Continued)

FOREIGN PATENT DOCUMENTS

EP    0243332 A1    10/1987

OTHER PUBLICATIONS

Chen, et al. "An Enhanced EDAC Methodology for Low Power PSRAM," International Test Conference, © 2006 IEEE, pp. 1-10.
(Continued)

*Primary Examiner* — Shelly A Chase
(74) *Attorney, Agent, or Firm* — Robert J. Shatto

(57) ABSTRACT

Embodiments of the present disclosure provide an approach for monitoring the health and predicting the failure of dynamic random-access memory (DRAM) devices with embedded error-correcting code (ECC). Additional registers are embedded on the DRAM device to store information about the DRAM, such as the number and location of soft errors detected by the device. When the DRAM device detects a soft error, it will update the information stored in the additional registers. A controller compares the information stored in the additional registers to associated thresholds. In some embodiments, after comparing the information to the associated thresholds, the controller may determine whether to schedule a repair action. In other embodiments, the controller may determine whether to alert the memory controller that the DRAM may be failing.

11 Claims, 7 Drawing Sheets

Related U.S. Application Data

No. 14/611,351, filed on Feb. 2, 2015, now Pat. No. 9,606,851.

(51) Int. Cl.
*H03M 13/15* (2006.01)
*H03M 13/19* (2006.01)

(58) Field of Classification Search
CPC ......... G06F 3/064; G11C 16/10; G11C 29/12; G11C 29/42; G11C 29/52; H03M 13/19; H03M 13/1515
See application file for complete search history.

(56) References Cited

U.S. PATENT DOCUMENTS

| | | | |
|---|---|---|---|
| 5,912,906 A | 6/1999 | Wu et al. | |
| 6,560,725 B1 | 5/2003 | Longwell et al. | |
| 6,792,567 B2 * | 9/2004 | Laurent | G06F 11/1044 714/763 |
| 7,225,318 B2 | 5/2007 | Tran et al. | |
| 7,318,183 B2 | 1/2008 | Ito et al. | |
| 7,640,392 B2 | 12/2009 | Walker | |
| 7,849,382 B2 | 12/2010 | Kasahara et al. | |
| 7,900,120 B2 | 3/2011 | Pawlowski et al. | |
| 8,331,189 B1 | 12/2012 | Pancoast et al. | |
| 8,601,332 B2 | 12/2013 | Jeddeloh | |
| 8,612,797 B2 | 12/2013 | Thayer et al. | |
| 8,615,700 B2 | 12/2013 | Dave et al. | |
| 8,837,215 B2 | 9/2014 | Lee | |
| 9,110,677 B2 | 8/2015 | Ravimohan et al. | |
| 9,471,423 B1 | 10/2016 | Healy et al. | |
| 9,606,851 B2 | 3/2017 | Healy et al. | |
| 9,626,242 B2 | 4/2017 | Healy et al. | |
| 9,684,555 B2 | 6/2017 | Healy et al. | |
| 9,690,649 B2 | 6/2017 | Healy et al. | |
| 2001/0052633 A1 | 12/2001 | Oikawa | |
| 2003/0154392 A1 | 8/2003 | Lewis | |
| 2004/0199786 A1 | 10/2004 | Walmsley et al. | |
| 2005/0081014 A1 | 4/2005 | Tran et al. | |
| 2005/0281112 A1 | 12/2005 | Ito et al. | |
| 2006/0109117 A1 | 5/2006 | Hsu et al. | |
| 2006/0118904 A1 | 6/2006 | Liaw | |
| 2008/0148124 A1 | 6/2008 | Zhang et al. | |
| 2008/0195795 A1 | 8/2008 | Imondi et al. | |
| 2008/0219075 A1 | 9/2008 | Ito et al. | |
| 2009/0217281 A1 | 8/2009 | Borkenhagen | |
| 2012/0239858 A1 | 9/2012 | Melik-Martirosian | |
| 2012/0239991 A1 | 9/2012 | Melik-Martirosian | |
| 2012/0278905 A1 | 11/2012 | Condorelli et al. | |
| 2013/0007343 A1 | 1/2013 | Rub et al. | |
| 2014/0157065 A1 | 6/2014 | Ong | |
| 2014/0215613 A1 | 7/2014 | Kelley et al. | |
| 2014/0223098 A1 | 8/2014 | Lee et al. | |
| 2014/0229774 A1 | 8/2014 | Melik-Martirosian | |
| 2014/0281151 A1 | 9/2014 | Yu et al. | |
| 2015/0161392 A1 | 6/2015 | Krummel | |
| 2015/0242331 A1 | 8/2015 | Van Winkelhoff et al. | |
| 2015/0331732 A1 | 11/2015 | Giovanni et al. | |
| 2015/0363262 A1 | 12/2015 | Hu et al. | |
| 2016/0064058 A1 | 3/2016 | Janesky et al. | |
| 2016/0239663 A1 | 8/2016 | Healy et al. | |
| 2016/0328284 A1 | 11/2016 | Healy et al. | |
| 2016/0328285 A1 | 11/2016 | Healy et al. | |
| 2016/0328290 A1 | 11/2016 | Healy et al. | |
| 2016/0328291 A1 | 11/2016 | Healy et al. | |
| 2016/0342469 A1 | 11/2016 | Healy et al. | |
| 2016/0342473 A1 | 11/2016 | Healy et al. | |
| 2017/0060657 A1 | 3/2017 | Healy et al. | |
| 2017/0123882 A1 | 5/2017 | Healy et al. | |

OTHER PUBLICATIONS

Godard et al., "Hierarchical Code Correction and Reliability Management in Embedded NOR Flash Memories," 13th European Test Symposium, 2008, pp. 84-90, © 2008 IEEE, DOI: 10.1109/ETS.2008.21.

Schroeder, et al. "DRAM Errors in the Wild: A Large-Scale Field Study," SIGMETRICS/Performance '09, Jun. 15-19, 12 pgs., © 2009 ACM.

Healy, et al., "Error Monitoring of a Memory Device Containing Embedded Error Correction," U.S. Appl. No. 15/401,744, filed Jan. 9, 2017.

List of IBM Patents or Patent Applications Treated as Related, Apr. 27, 2017, 2 pgs.

Zetter, K. "Researchers Hack Air-Gapped Computer with Simple Cell Phone," https://www.wired.com/2015/07/researchers-hack-air-gapped-computer-simple-cell-phone, Jul. 27, 2015, 8 pgs.

Weissman, C. "The insane ways your phone and computer can be hacked—even if they're not connected to the internet," http://www.businessinsider.com/the-insane-ways-your-offline-devices-can-be-hacked-2015-7/#tecting-electromagnetic-radiation-1, Jul. 9, 2015, 10 pgs.

* cited by examiner

ERROR MONITORING OF A MEMORY DEVICE CONTAINING EMBEDDED ERROR CORRECTION

BACKGROUND OF THE INVENTION

The present disclosure relates generally to the field of computing hardware, and more particularly to coupling dynamic random-access memory (DRAM) devices with embedded error-correcting code (ECC) with registers to log and correct memory errors.

Dynamic memory cells store charges in capacitors. These capacitors continue to shrink in size in order to accommodate increasing memory demand. As the capacitors get smaller, the dynamic memory cells become increasingly susceptible to single cell soft errors caused by reduced cell retention time, electrical or magnetic interference, and background radiation. To combat the increase in soft errors, some DRAM manufactures are embedding error-correcting code (ECC) directly on the DRAM device, instead of relying on the central processing unit (CPU) or system memory controller.

DRAM capacitors lose their charge over time and must be refreshed to avoid losing information. Many DRAM devices have a maximum time between refreshes in the milliseconds. The rate at which DRAM capacitors lose their charge may be temperature dependent. If a DRAM capacitor is cooled down significantly, the charges may persist longer than they do at normal operating temperatures, possibly lasting minutes to hours instead of the usual seconds.

SUMMARY

Embodiments of the present invention disclose an apparatus and method for monitoring the health, and predicting the failure of, dynamic random-access memory (DRAM) devices with embedded error-correcting code (ECC). In an embodiment, this disclosure includes a DRAM device with embedded ECC. The DRAM device further contains a register to store a running count of the number or errors detected, and a register bank to store the memory addresses of the detected errors. The DRAM device further contains an ECC controller, where the controller is configured to perform error detection and correction (EDAC) using the ECC.

In another embodiment, this disclosure includes a method for logging and correcting soft errors in a DRAM device with embedded ECC. The DRAM device conducts an ECC check of a word to determine if there are any soft errors present in the word. Upon detecting an error, an error count stored in a register on the DRAM device is incremented, and the memory address corresponding to the location of the error is saved in a register bank on the DRAM device.

In additional embodiments, this disclosure includes a method for predicting failure in the DRAM. A DRAM device receives a set of memory information about a DRAM. The DRAM device processes the set of memory information to determine a set of error indicators. The DRAM device then compares the set of error indicators to associated thresholds and, if at least one of the set of error indicators exceeds its associated threshold, alerts a memory controller.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present invention and, along with the description, serve to explain the principles of the invention. The drawings are only illustrative of typical embodiments of the invention and do not limit the invention.

DETAILED DESCRIPTION

Figure 1:
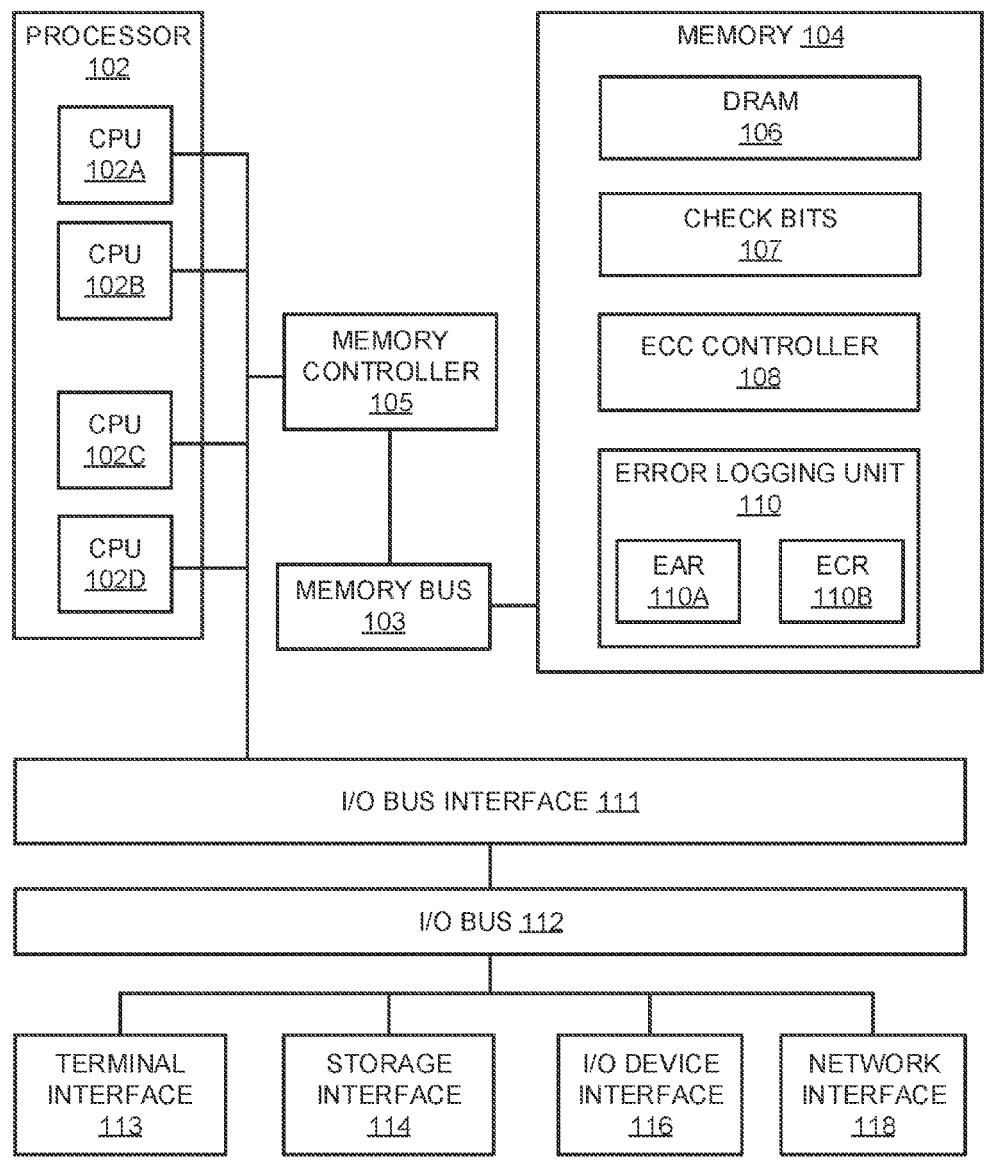
FIG. 1 illustrates a high-level block diagram of an example computer system that may be used in implementing one or more of the methods, tools, and modules, and any related functions, described herein, in accordance with embodiments of the present disclosure.

The present disclosure relates generally to the field of computing hardware, and more particularly to coupling dynamic random-access memory (DRAM) devices with embedded error-correcting code (ECC) with registers to log and identify the need to repair memory. While the present disclosure is not necessarily limited to such applications, various aspects of the disclosure may be appreciated through a discussion of various examples using this context.

DRAM is a type of random-access memory that stores each bit of data in a separate capacitor in a memory cell within an integrated circuit. The capacitor can be either charged or discharged, representing the binary values (1 or 0) of a data bit. Occasionally, a bit may spontaneously flip from one binary value to the opposite binary value, creating a soft error. Soft errors can be caused by electrical and magnetic interference, an alpha particle hitting a cell, and background radiation.

The consequences of a soft error in memory can be system-dependent. In systems without ECC, a soft error may cause no noticeable consequence, or it may lead to a system crash or data corruption. For example, assume a spreadsheet storing numbers in ASCII format is loaded into an application's memory, the digit "8" is then entered into a data cell and the spreadsheet is subsequently saved. That "8" may be represented by the binary bit sequence 00111000, with each bit in the sequence stored in a separate memory cell. If the memory cell storing the least significant bit (furthest right) of the binary bit sequence were hit by an alpha particle before the spreadsheet was saved, causing the bit to flip from a 0 to a 1, when the spreadsheet is subsequently reloaded into memory the data cell that previously contained the digit "8" may now contain the digit "9." While such a change may not always cause system instability, its effects can be unacceptable for systems running scientific and financial computing applications, and for file servers.

Systems that are intolerant to data corruption can use ECC memory to correct errors that arise. ECC memory may use additional memory chips to allow for the addition of check bits. When a memory cell is accessed during a read, write, or refresh operation, the memory controller or, more recently, the central processing unit (CPU), can use an ECC in conjunction with the check bits to check for errors. If an error is found, the memory controller or CPU may correct the error, depending on the number of flipped bits and the ECC used. Examples of ECCs used to correct soft errors include Hamming codes and Reed-Solomon codes.

A cold-boot attack is a type of side channel attack in which an attacker with physical access to a computer is able to retrieve encryption keys from a running operating system after using a cold reboot to restart the machine. The attack relies on the data remanence property of DRAM to retrieve memory contents that remain readable after power has been removed. In a cold-boot attack, power is turned off without letting the operating system perform its shut down operations, and the memory contents are dumped to a file. A cryogenic attack is a type of cold-boot attack where the DRAM is first cooled down in order to slow the capacitor leak within the individual DRAM cells. By slowing the memory leak in the DRAM device, the attacker may be able to dump more of the DRAM information to file, increasing the odds of successfully stealing the encryption key.

As used herein, "memory information" is any information about the DRAM that may be useful in predicting failure in the DRAM, or in detecting a cryogenic attack on the memory. For example, memory information may include an error count, the DRAM's temperature, or a count of the number of sequential read operations without a write operation. A "word" is the natural unit of data used by a particular processor design, and may be related to the size of a bus transfer. Some modern computers and servers use a 64-bit word, but other word sizes exist, and the present disclosure should not be limited to any particular word size.

An "error rate" is the rate at which new errors are occurring in the DRAM. For example, if 15 new errors occurred over a 3 second time interval, the error rate would be 5 new errors per second. An "error acceleration" is the change in the error rate over a period of time. For example, if the error rate changed from 5 new errors/second to 10 new errors/second over a 1 second time interval, the error acceleration would be 5 new errors per second squared. An "error indicator" is any information about the DRAM that may be compared to established thresholds to determine whether failure of the DRAM, or a cryogenic attack on the DRAM, is occurring. For example, an error indicator may be the error count, the error rate, the error acceleration, or the DRAM temperature. An "associated threshold" is a threshold that corresponds to a given error indicator. For example, the associated threshold of an error count may be the maximum number of errors the DRAM can tolerate, while the associated threshold of an error rate may be the maximum tolerable rate of new errors in the DRAM.

A "repair action" includes any action performed on the DRAM to repair or prevent soft errors. For example, in some embodiments the repair action may be running a memory scrub operation. In other embodiments, particularly when a memory cell or row has had numerous errors, the repair action may be to spare or mark the hardware such that the computer system will no longer store information in the affected memory cell or row, or ultimately to replace the DRAM.

Referring now to the Figures, FIG. 1 is a high-level block diagram of an example computer system (e.g. a server) 101 in which illustrative embodiments, such as the methods, tools, and modules, and any related functions, described herein (e.g., using one or more processor circuits or computer processors of the computer), may be implemented. In some embodiments, the major components of the computer system 101 may include one or more CPUs 102, a memory controller 105, a memory 104, a terminal interface 113, a storage interface 114, an input/output (I/O) device interface 116, and a network interface 118, all of which may be communicatively coupled, directly or indirectly, for inter-component communication via a memory bus 103, an I/O bus 112, and an I/O bus interface unit 111.

The computer system 101 may contain one or more general-purpose programmable central processing units (CPUs) 102A, 102B, 102C, and 102D, herein generically referred to as the CPU 102. In some embodiments, the computer system 101 may contain multiple processors, typical of a relatively large system. In other embodiments, the computer system 101 may be a single CPU system. Each CPU 102 may execute instructions stored in the memory 104 and may include one or more levels of on-board cache (not shown).

Memory 104 may include computer system readable media in the form of volatile memory, such as dynamic random-access memory (DRAM) 106. Computer system 101 may further include removable/non-removable, volatile/non-volatile computer system storage media. By way of example only, a storage system may be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 104 can include flash memory, e.g., a flash memory stick or a flash drive. Memory devices can be connected to memory bus 103 by one or more data media interfaces. The memory 104 may include at least one program product having a set (e.g., at least one) of program modules that are configured to carry out the functions of various embodiments.

Memory 104 may further include ECC check bits 107, an ECC controller 108, and an error logging unit 110. The error logging unit may comprise an error address register (EAR) bank 110A and an error count register (ECR) 110B. The EAR bank 110A may be a bank of registers, where each register stores the location of an error detected by the ECC controller 108. For example, the EAR bank 110A may store the row address, the column address, or both the row and column address of a memory cell in which the ECC controller 108 detected an error. The ECR 110B may be a register in which an error count is stored. The error count is a running tally of the number of errors discovered by the ECC controller 108. Both the ECR 110B and the EAR bank 110A may be reset periodically. Alternatively, in some embodiments the ECR 110B and EAR bank 110A may be reset as part of a repair action, by the memory controller 105, by the ECC controller 108, or by the user.

The ECC controller 108 may be configured to perform forward error correction (FEC) on the DRAM 106 using the check bits 107 and an error-correcting code, such as a Hamming Code or a Reed-Solomon Code. The number of check bits 107 stored on the memory may depend on both the size of the DRAM 106 and the error-correcting code used. The ECC controller 108 may be further configured to increment the ECR 110B when it detects a soft error, and to save information about the error, such as the row and column address of an error, in the EAR bank 110A.

In some embodiments, the error logging unit 110 may include additional registers and register banks to store additional information about the DRAM. For example, in some embodiments the error logging unit 110 may store a multi-bit error count that increments whenever the ECC controller 108 detects a multi-bit error. In some embodiments, the error logging unit 110 may store bank-specific error counts that tally the number of errors found in particular memory banks within the DRAM 106. Additionally, the error logging unit 110 may store an uncorrectable error flag that alerts the memory controller 105 whenever an uncorrectable error is found in the DRAM 106.

In some embodiments, as described above, the ECC controller 108 communicates directly with the error logging unit 110 to, e.g., increment the error count in the ECR 110B. In other embodiments, however, the ECC controller 108 may indirectly communicate with the error logging unit 110. For example, upon detecting an error, the ECC controller 108 may alert the memory controller 105 to the location of the error. The memory controller 105 may then communicate with the error logging unit to increment the ECR 110B and store the error address in the EAR bank 110A.

In some embodiments, there may be multiple memory controllers. For example, the CPU may have an integrated memory controller that is designed to interact with an external memory device. In some embodiments, an external memory controller may contain the ECC controller.

Memory 104 may include additional chips, sensors, or controllers not shown. For example, the memory 104 may include a temperature sensor, a failure detection unit, or a cryo-attack detection unit. The failure detection unit may predict the beginning of catastrophic failure within the memory 104 and alert the controller. The cryo-attack detection unit may monitor the DRAM 106 for signs that the memory 104 is experiencing a cryogenic attack, a type of cold-boot attack. The temperature sensor may monitor the operating temperature of the DRAM and assist the cryo-attack detection unit. The failure detection unit is discussed more thoroughly in reference to FIGS. 4 and 5, and the cryo-attack detection unit is discussed more thoroughly in reference to FIGS. 6 and 7.

Although the memory bus 103 is shown in FIG. 1 as a single bus structure providing a direct communication path among the CPUs 102, the memory 104, and the I/O bus interface 111, the memory bus 103 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 111 and the I/O bus 112 are shown as single respective units, the computer system 101 may, in some embodiments, contain multiple I/O bus interface units 111, multiple I/O buses 112, or both. Further, while multiple I/O interface units are shown, which separate the I/O bus 112 from various communications paths running to the various I/O devices, in other embodiments some or all of the I/O devices may be connected directly to one or more system I/O buses.

In some embodiments, the computer system 101 may be a multi-user mainframe computer system, a single-user system, or a server computer or similar device that has little or no direct user interface, but receives requests from other computer systems (clients). Further, in some embodiments, the computer system 101 may be implemented as a desktop computer, portable computer, laptop or notebook computer, tablet computer, pocket computer, telephone, smart phone, network switches or routers, or any other appropriate type of electronic device.

It is noted that FIG. 1 is intended to depict the representative major components of an exemplary computer system 101. In some embodiments, however, individual components may have greater or lesser complexity than as represented in FIG. 1, components other than or in addition to those shown in FIG. 1 may be present, and the number, type, and configuration of such components may vary.

Figure 2:
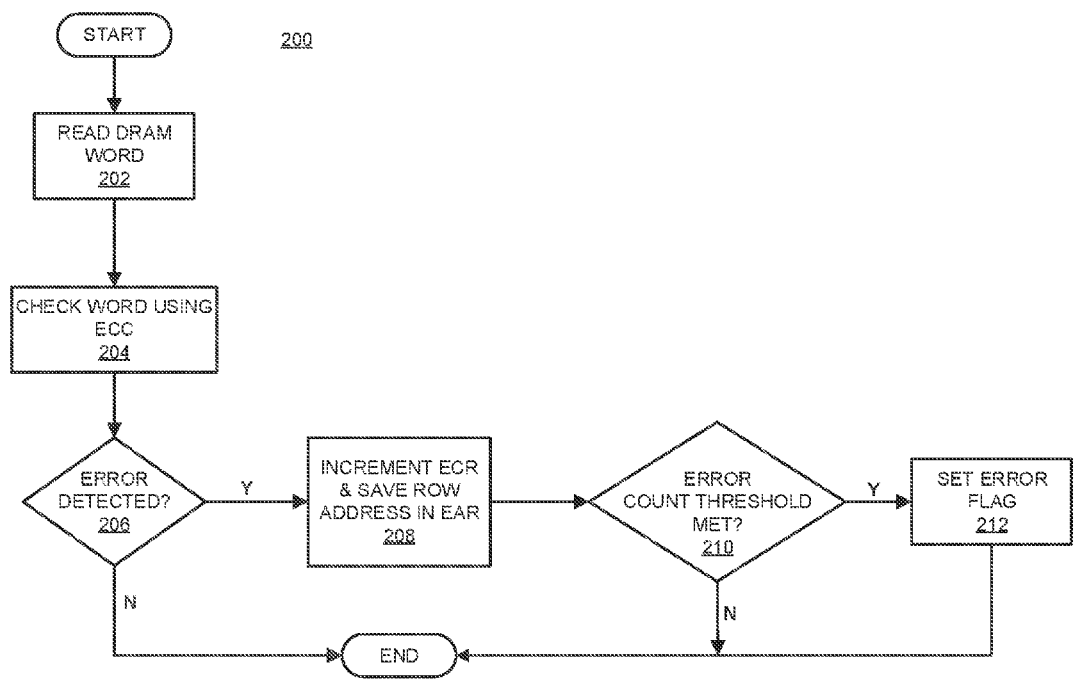
FIG. 2 is a flowchart illustrating a method for logging errors in a dynamic random-access memory (DRAM) device with embedded ECC functionality, in accordance with embodiments of the present disclosure.

Referring now to FIG. 2, shown is a flowchart of an example method 200 for logging memory information about a DRAM device, in accordance with an embodiment of the present disclosure. In some embodiments, the method 200 may be performed by an ECC controller 108 (shown in FIG. 1) embedded in the memory 104. In other embodiments, the method 200 may be performed by the memory controller 105 of a computer system 101. The method may begin at operation 202, wherein a DRAM device performs a read, write, or refresh operation.

As part of, or following, a read, write, or refresh operation of a word at a memory address, the ECC controller may check the word for errors at operation 204. The ECC controller may check the word for errors using an existing error-correcting code or algorithm, such as a Hamming Code or a Reed-Solomon code.

At operation 206, the ECC controller may determine if any errors were detected in the word during operation 204. If no errors were detected, the method ends. If, however, an error was detected at operation 204, the ECC controller may increment an error count saved in the ECR and save the row address of the error location in an available register in the EAR bank per operation 208.

At operation 210, the ECC controller may compare the error count to an error threshold. The error threshold may be, e.g., the maximum number of errors tolerable in the DRAM. If the error count is below the threshold, the method ends. If, however, the ECC controller determines that the error count exceeds the error threshold, the ECC controller will set an error flag, as depicted in operation 212. An error flag can be a message, stored in memory or sent directly to a memory controller, which indicates that the error count has exceeded the threshold. In alternative embodiments, the error flag may be set by driving a pin in the DRAM device high or low.

Figure 3:
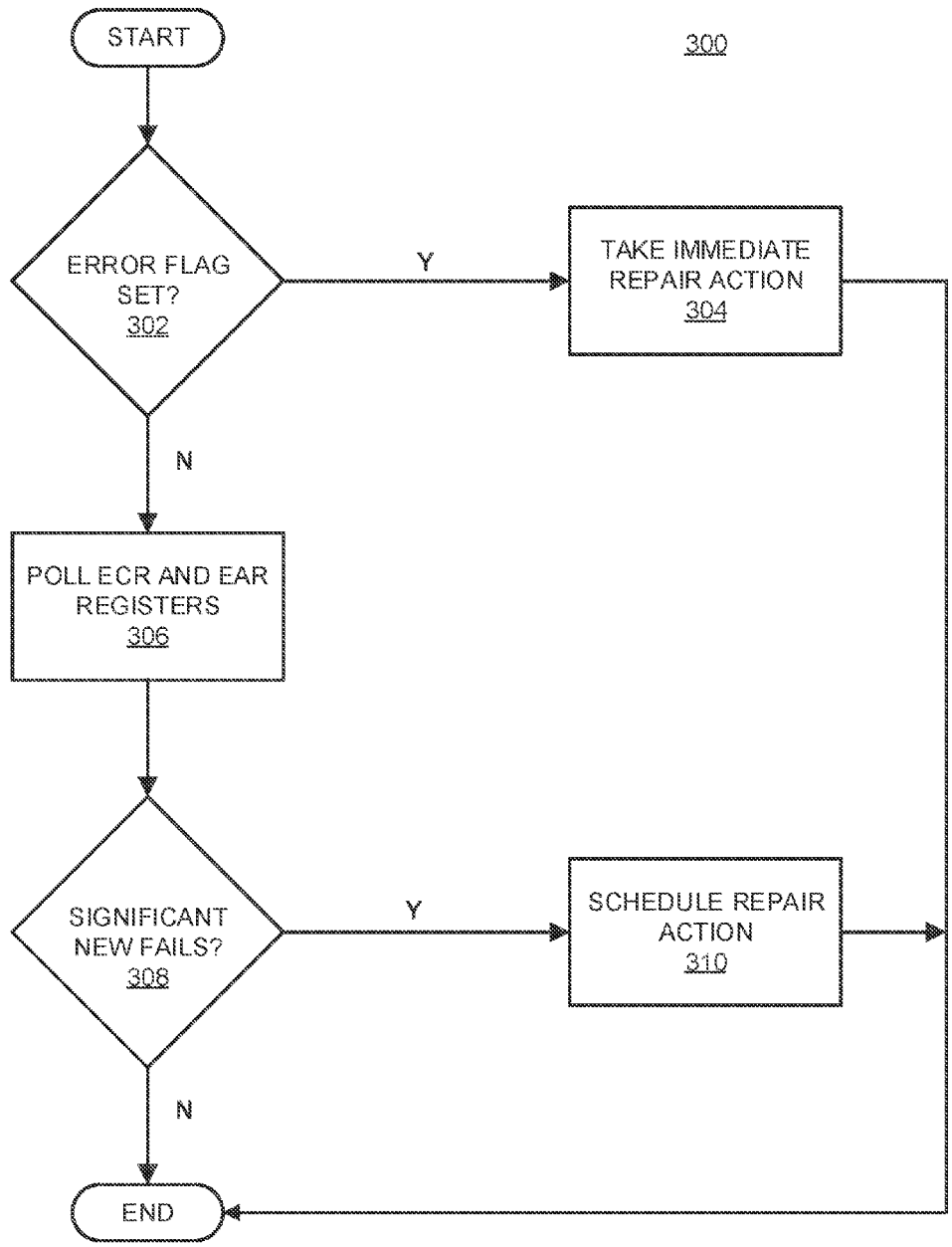
FIG. 3 is a flowchart illustrating a method for identifying the need to take repair actions in a DRAM device with embedded ECC functionality, in accordance with embodiments of the present disclosure.

Referring now to FIG. 3, shown is a flowchart illustrating an example method 300 for monitoring the health of a DRAM device, in accordance with an embodiment of the present disclosure. In some embodiments, the method 300 may be performed by an ECC controller 108 (shown in FIG. 1) embedded in a memory 104. In other embodiments, the method 300 may be performed by a memory controller 105 integrated into a computer system 101. In still other embodiments, the method 300 may be performed by a dedicated controller or chip embedded in the DRAM device. The method may begin at operation 302 where the memory controller determines whether an error flag is set. The memory controller may determine whether the error flag is set by, e.g., reading a message stored in a particular memory address. If a predetermined message indicating that the error threshold has been surpassed is found at the memory address, the memory controller may determine that the error flag is set.

If the memory controller determines that the error flag is set, the memory controller may perform a repair action per operation 304. If the memory controller determines that the error flag is not set at operation 302, the memory controller may retrieve memory information from the error logging unit, per operation 306. The retrieved memory information may include the error count stored in the ECR 110B and the list of error addresses stored in the EAR bank 110A. The memory controller may determine whether there is a significant number of new errors at operation 308. To determine if there is a significant number of new errors, the memory controller may compare the total number of new errors to a threshold.

In some embodiments, the memory controller may compare the number of new errors in a particular register bank to a bank-specific threshold. In other embodiments, the memory controller may compare the number of new errors at a particular address (including at a particular row or column) to appropriate address thresholds. In any case, the thresholds may be configured by a user, or may be set by the memory manufacturer and stored on the DRAM device or module in non-volatile memory. If the memory controller determines that there is not a significant number of new errors, the method will end.

When the memory controller determines that there is a significant number of new errors, the memory controller may schedule a repair action per operation 310. In some embodiments, the memory controller may immediately perform the repair action after determining that there is a significant number of new errors and available repair resources.

Figure 4:
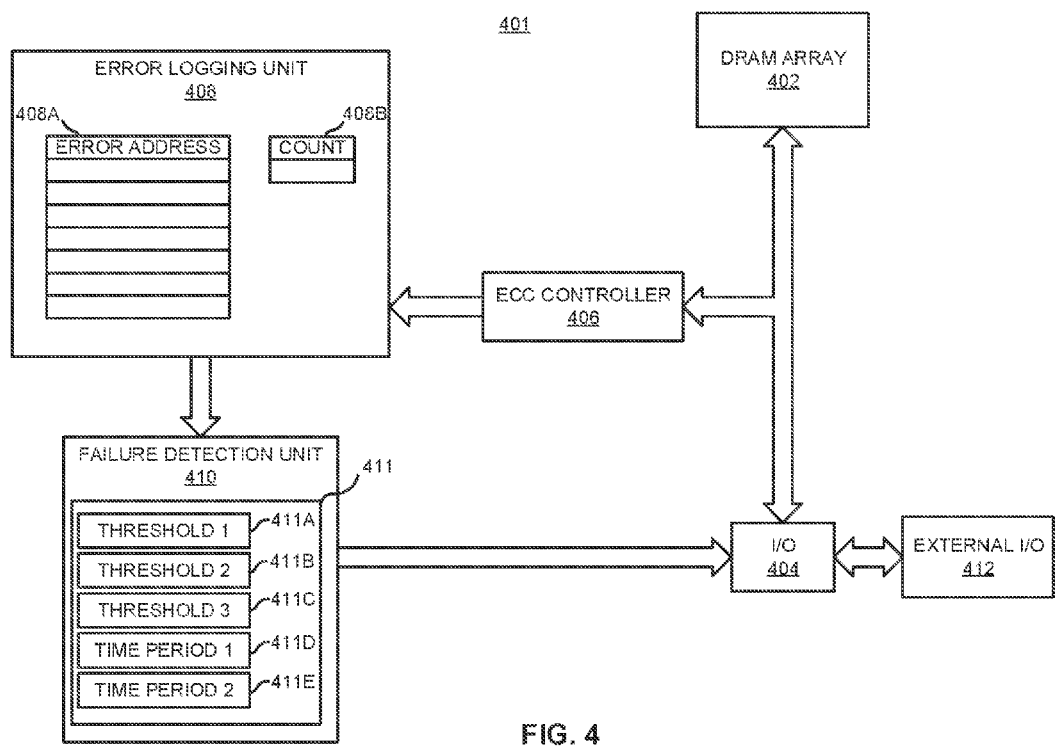
FIG. 4 is a block diagram of an example DRAM device with embedded ECC functionality, an error logging unit, and a failure detection unit, in accordance with embodiments of the present disclosure.

Referring now to FIG. 4, shown is a block diagram of a DRAM device with embedded ECC that is used to predict failure of a DRAM, in accordance with an embodiment of the present disclosure. The DRAM device includes a DRAM array 402, an ECC controller 406, an error logging unit 408, and a failure detection unit 410, all communicatively coupled, directly or indirectly, with a computer system (not shown) through an I/O 404 connected to an external I/O 412. The I/O 404 is the DRAM driver, embedded on the DRAM device, which provides the voltage or current to the external I/O 412. The external I/O 412 may be a new additional pin on the DRAM device, or it may be a new multiplexed definition of an existing pin.

The ECC controller 406 may use an error-correcting code, such as a Hamming Code or Reed-Solomon code, to detect single-bit and multi-bit errors in the DRAM array 402. Depending on the error-correcting code used, the ECC controller 406 may also correct the detected errors, especially in the case of single-bit errors. When the ECC controller 406 detects an error, it stores memory information in the error logging unit 408.

Memory information may include the error address 408A, which is the memory address of a cell in which the ECC controller 406 detected an error, and an error count 408B, which is a running tally of the number of errors found by the ECC controller 406 since the error logging unit 408 was last reset. In some embodiments, the error logging unit 408 may store additional memory information. For example, the error logging unit 408 may store a second error count that corresponds to the number of multi-bit errors detected by the ECC controller. In other embodiments, the error logging unit 406 may store bank-specific error counts that tally the number of errors that the ECC controller 406 detected in each unique bank within the DRAM array 402. In still other embodiments, the memory information stored in the error logging unit 408 may include an uncorrectable error count (the number of uncorrectable errors detected by the ECC controller 406), the temperature of the DRAM, and an error flag.

The failure detection unit 410 may store decision parameters 411. The decision parameters 411 are parameters utilized by the failure detection unit 410 to determine error indicators, such as the error rate and error acceleration of the DRAM, and thresholds to compare with the error indicators to predict failure in the DRAM. For example, the decision parameters may include thresholds 411A, 411B, and 411C, as well as time periods 411D and 411E. The first threshold 411A may be the maximum tolerable error count; the second threshold 411B may be the maximum tolerable error rate; and, the third threshold 411C may be the maximum tolerable error acceleration. The first time period 411D may be used in calculating an error rate, while the second time period 411E may be used to calculate an error acceleration.

The failure detection unit 410 may monitor the error count 408B over a first time period 411D to determine the error rate. The failure detection unit may then monitor the error rate over a second time period 411E to determine the error acceleration. Once the failure detection unit has determined the error count, the error rate, and the error acceleration, it may compare them to their associated thresholds, 411A, 411B, and 411C respectively. If the error count, error rate, or error acceleration exceed their associated thresholds, the failure detection unit may alert the memory controller that the DRAM may be about to fail, or that the system may become unstable.

In some embodiments, the failure detection unit may include a controller that compares the memory information stored in the error logging unit 408 to the decision parameters 411. In other embodiments, the ECC controller 406 or an external memory controller, such as memory controller 105 shown in FIG. 1, may be configured to compare the memory information to the decision parameters 411. In these embodiments, the failure detection unit 410 may only store the decision parameters 411.

FIG. 4 depicts the representative major components of an exemplary DRAM device 401. In some embodiments, however, individual components may have greater or lesser complexity than as represented in FIG. 4, components other than or in addition to those shown in FIG. 4 may be present, and the number, type, and configuration of such components may vary. For example, a single memory controller may be configured to perform the duties of the ECC controller 406 and the failure detection unit 410 in some embodiments.

In some embodiments, the decision parameters 411 may be configured by the user. In other embodiments, the decision parameters 411 may be preloaded onto nonvolatile memory by the DRAM manufacturer. In some embodiments, the information stored in the error logging unit 408, such as the error addresses 408A and the error count 408B, may be reset after the DRAM performs a given operation, such as a memory scrub operation. In other embodiments, the error logging unit 408 may be reset by the failure detection unit 410 or by the memory controller 105.

Figure 5:
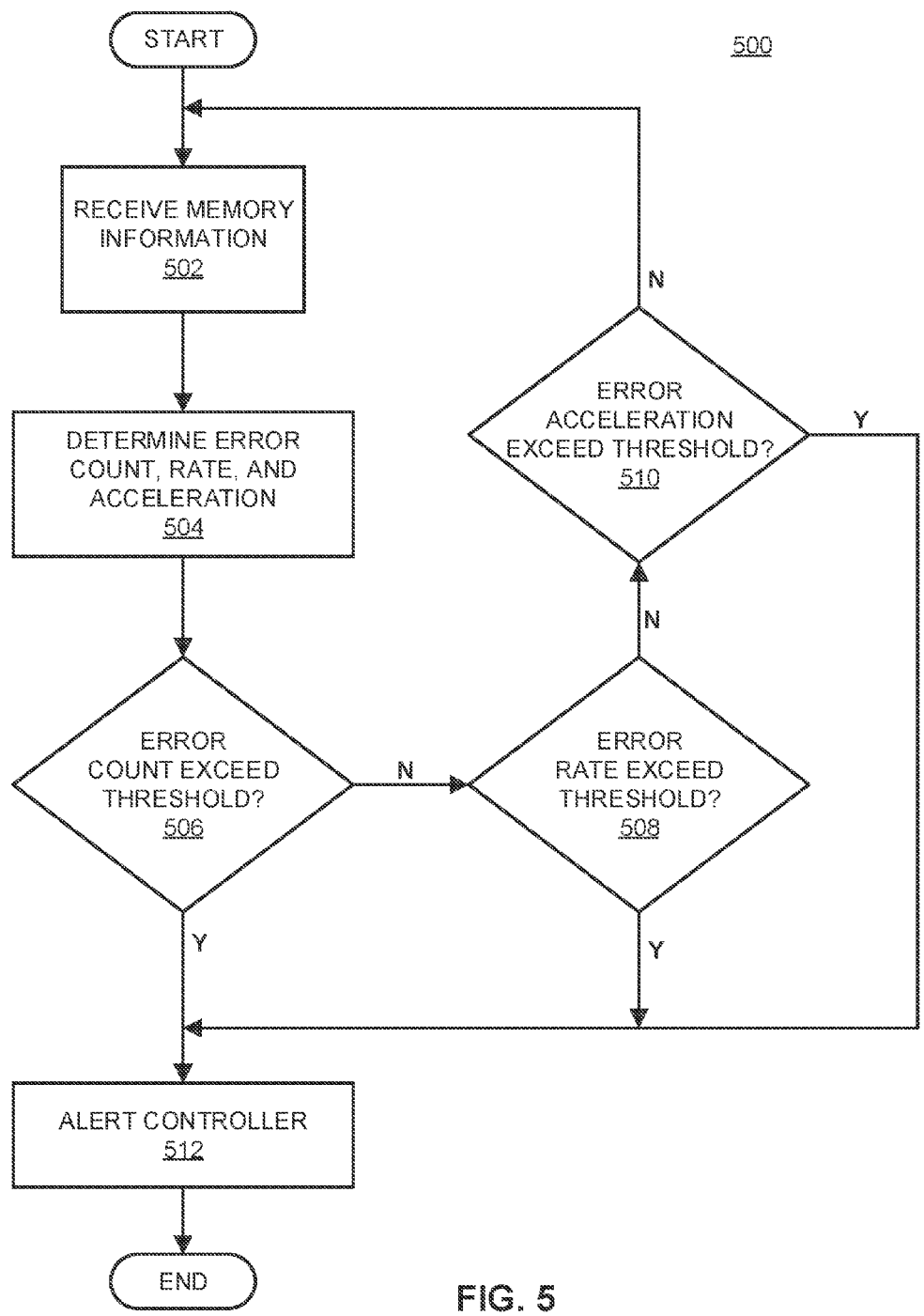
FIG. 5 is a flowchart illustrating a method for predicting failure in a DRAM device with embedded ECC functionality, in accordance with embodiments of the present disclosure.

Referring now to FIG. 5, shown is a flowchart illustrating an example method 500 for predicting failure of a DRAM device, in accordance with an embodiment of the present disclosure. In some embodiments, the method 500 may be performed by a failure detection unit 410 embedded in a DRAM device. In other embodiments, the method 500 may be performed by a memory controller 105 integrated into a computer system 101. The method may begin at operation 502, where the failure detection unit receives memory information from an error logging unit.

At operation 504, the failure detection unit may determine error indicators by processing the memory information received at operation 502. The error indicators may be the error count, the error rate (the rate at which new errors are occurring in the DRAM) and the error acceleration (the change in the rate of new errors over a time period). In some embodiments, the error indicators may also include an uncorrectable error rate (the rate at which uncorrectable errors are occurring in the DRAM) and an uncorrectable error acceleration (the change in the rate of uncorrectable errors over a time period). An error is considered uncorrectable if the number of flipped bits exceeds the maximum number correctable by the error-correcting code embedded on the DRAM device. After determining the error indicators (in this example, the error count, error rate, and error acceleration), the failure detection unit may determine whether any error indicator exceeds its associated threshold.

First, the failure detection unit may determine whether the error count exceeds its associated threshold per operation 506. If the error count exceeds its associated threshold, the failure detection unit may alert the memory controller 105 (shown in FIG. 1) at operation 512, and the process may end. If the error count does not exceed the associated threshold at operation 506, the failure detection unit may determine whether the error rate exceeds its associated threshold per operation 508. If the error rate exceeds its associated threshold, the failure detection unit may alert the memory controller 105 at operation 512, and the process may end. If the error rate does not exceed its associated threshold, the failure detection unit may determine whether the error acceleration exceeds its associated threshold per operation 510. If the error acceleration exceeds its associated threshold, the failure detection unit may alert the memory controller 105 at operation 512, and the process may end. If the error acceleration does not exceed the associated threshold, the method may start over at operation 502 wherein the failure detection unit may receive memory information from the error logging unit.

Alerting the memory controller 105 at operation 512 can be done in a number of ways. In some embodiments, alerting the memory controller 105 may include raising or lowering a dedicated pin on the DRAM device, e.g., driving a parity error pin on the DRAM device high or low. In other embodiments, alerting the memory controller 105 may include intentionally corrupting read data so as to trigger a cyclic redundancy check (CRC) error. In yet other embodiments, alerting the memory controller 105 may include sending a predefined data pattern to the controller, which the controller will recognize as an error signal. The present disclosure does not require, and should not be limited to, any particular method for alerting the memory controller when an error indicator exceeds its associated threshold.

Figure 6:
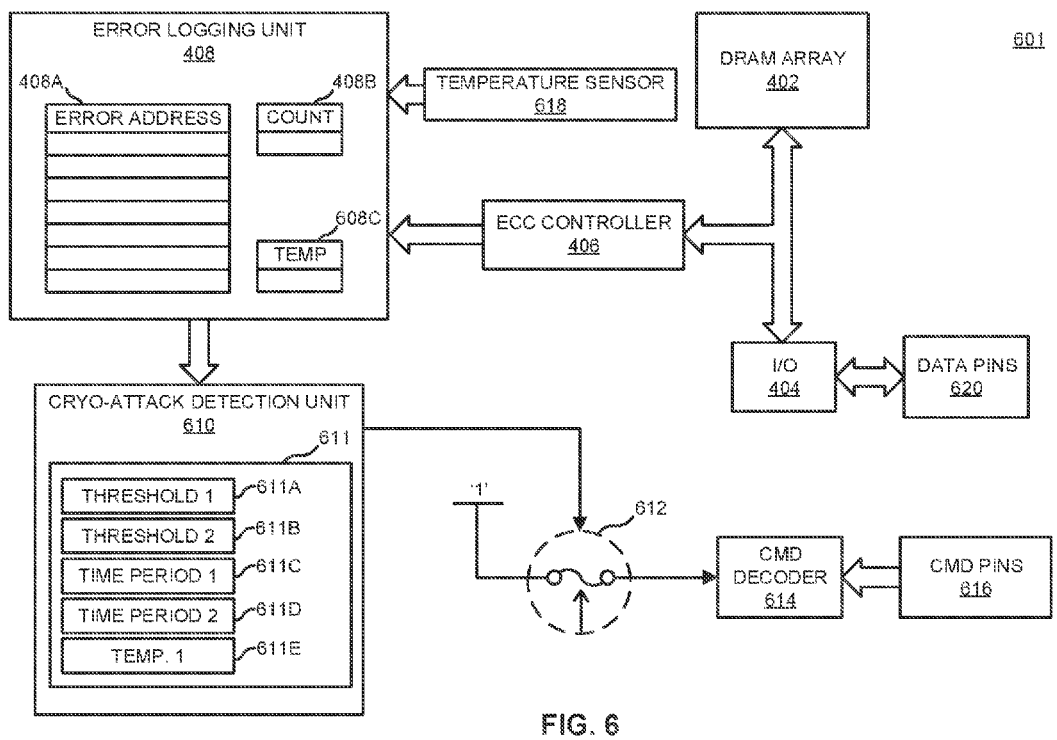
FIG. 6 is a block diagram of an example DRAM device with embedded ECC functionality, an error logging unit, and a cryogenic attack detection unit, in accordance with embodiments of the present disclosure.

Referring now to FIG. 6, shown is a block diagram of a DRAM device, with embedded ECC, that is able to detect and respond to a cryogenic attack, in accordance with an embodiment of the present disclosure. The DRAM device consists of a DRAM array 402, an ECC controller 406, a temperature sensor 618, an error logging unit 408, a cryo-attack detection unit 610, and a fuse 612, the DRAM device being communicatively coupled with a computer system (not shown) through an I/O 404 connected to data pins 620 and a command (CMD) decoder 614 connected to command (CMD) pins 616.

The data pins 620 are the DRAM device's data I/O pins. The data pins 620 are bi-directional pins, with input capability allowing for data writes and output capability allowing for data reads. Depending on the device, there may be 4, 8, 16, or 32 data pins 620. Other configurations could also be possible, and the present disclosure should not be limited to devices with any specific number of data pins 620.

The CMD pins 616 are a set of input pin on the DRAM device which provide the commands (e.g., read, write, refresh) multiplexed with the cell address which will be accessed. The CMD decoder 614 is a decoder on the DRAM device which interprets the encoded command inputs provided on the CMD pins 616, and enables the DRAM to execute the proper operation (e.g., read, write, refresh).

The DRAM array 402, ECC controller 406, and error logging unit 408 operate as described in reference to FIG. 4 above. The ECC controller 406 uses an error-correcting code to detect errors in the DRAM array 402, and stores memory information in the error logging unit 408. Additionally, the error logging unit 408 stores the DRAM's temperature 608C, which it receives from a temperature sensor 618.

Much like the failure detection unit described herein, the cryo-attack detection unit 610 stores a plurality of decision parameters 611. The decisions parameters 611 may be configurable by the user, or set by the manufacturer, to assist the cryo-attack detection unit 610 in determining whether the DRAM is experiencing a cryogenic attack.

For example, the cryo-attack detection unit 610 may use a first time period 611C to calculate an uncorrectable error rate, and a second time period 611D to calculate an uncorrectable error acceleration. The cryo-attack detection unit 610 may determine whether the uncorrectable error rate and uncorrectable error acceleration exceeds a first threshold 611A and a second threshold 611B, respectively. Alternatively, in some embodiments, the cryo-attack detection unit 610 may compare the DRAM temperature 608C to a temperature threshold 611E to determine if the DRAM is operating at a temperature that indicates a cryogenic attack.

If the cryo-attack detection unit 610 determines that the DRAM is experiencing a cryogenic attack, it may disable access to the information on the DRAM. In some embodiments, this may be done by tripping a fuse 612. The fuse 612 may be, e.g., an electronic fuse (e-fuse), a programmable resistor, or a phase-change resistor.

Figure 7:
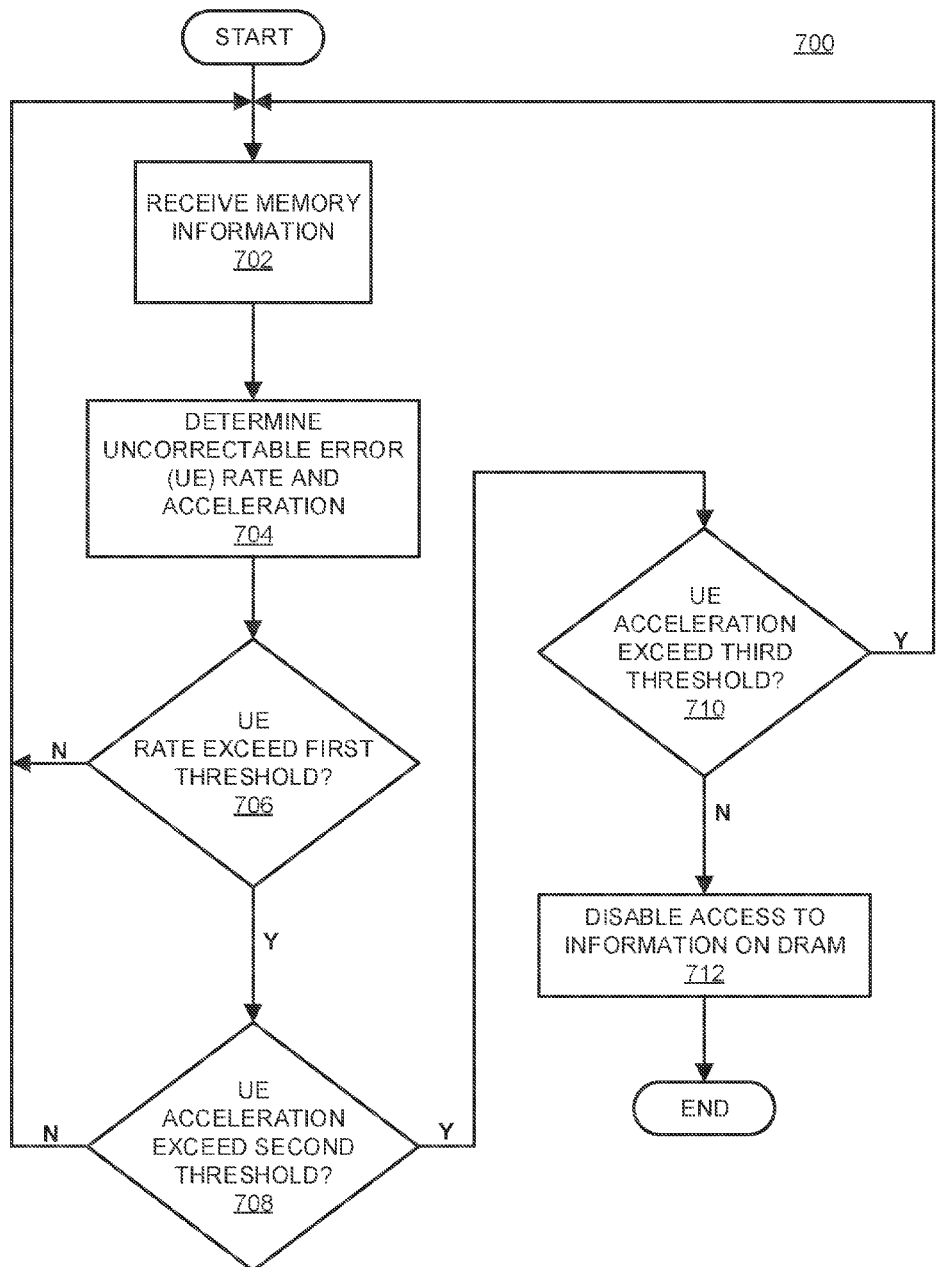
FIG. 7 is a flowchart illustrating a method for detecting a cryogenic attack in a DRAM device with embedded ECC functionality, in accordance with embodiments of the present disclosure.

Referring now to FIG. 7, shown is a flowchart of an example method 700 for detecting and responding to a cryogenic attack of a DRAM device, in accordance with an embodiment of the present disclosure. In some embodiments, the method 700 may be performed by a cryo-attack detection unit 610 embedded in a memory 104. In other embodiments, the method 700 may be performed by a memory controller 105 integrated into a computer system 101. In still other embodiments, the method may be included in the DRAM control logic.

The method 700 may involve first determining a set of error indicators by processing a set of memory information using a set of decision parameters. Then, the cryo-attack detection unit may compare the set of error indicators to a predetermined attack syndrome. The attack syndrome may be a set of conditions that may be present when a DRAM device is experiencing a cryogenic attack, or when the DRAM device has been electrically probed. For example, in some embodiments, the attack syndrome may be a very high error rate, especially if the errors are uncorrectable. In other embodiments, the attack syndrome may be a high error acceleration, again especially if the errors are uncorrectable. In still other embodiments, the attack syndrome may be a very low temperature.

In some embodiments of the present disclosure, the attack syndrome may be stored in non-volatile memory on the DRAM device by the DRAM manufacturer. For example, the attack syndrome could be thresholds stored as decision parameters in the cryo-attack detection unit. In other embodiments, the attack syndrome may be configured by a user. In still other embodiments, a first attack syndrome may be stored in non-volatile memory on the DRAM device by the DRAM manufacturer, and a user may establish additional attack syndromes to satisfy his particular needs.

In some embodiments, the attack syndrome may be a combination of high error rates, high error accelerations, and/or low temperature. For example, in the example method 700, the attack syndrome is characterized as having a high uncorrectable error rate (above a first threshold) and an heightened uncorrectable error acceleration (above a second threshold), where the heightened uncorrectable error acceleration is lower than would be expected if the computer system was undergoing a normal shutdown operation (i.e. lower than a third threshold). The method 700 may begin at operation 702, where the cryo-attack detection unit receives memory information from the error logging unit.

At operation 704, the cryo-attack detection unit may determine the uncorrectable error (UE) rate and acceleration. The UE rate may be determined by calculating the number of uncorrectable errors found over a specified time period, such as the first time period 611C stored in the cryo-attack detection unit 610. For example, if the first time period 611C is 2 seconds, and 4 new uncorrectable errors were detected during the two seconds, the UE rate would be determined to be 2 uncorrectable errors per second. The UE acceleration may be determined by calculating the change in the UE rate over a time period, such as the second time period 611D. For example, if the UE rate changed from 1 uncorrectable error per second to 3 uncorrectable errors per second over a 1 second time period, the UE acceleration may be determined to be 2 uncorrectable errors per second squared.

At operation 706, the cryo-attack detection unit may determine whether the UE rate exceeds a first threshold. This may be done by comparing the calculated UE rate to, e.g., the first threshold 611A stored in the cryo-attack detection unit 611. If the UE rate does not exceed the first threshold, the method may start over at operation 702. If the UE rate exceeds the first threshold, the cryo-attack detection unit may determine whether the UE acceleration exceeds a second threshold per operation 708.

If the UE acceleration does not exceed the second threshold, the method may start over at operation 702. If the UE acceleration exceeds the second threshold, the cryo-attack detection unit may determine whether the UE acceleration exceeds a third threshold at operation 710. Comparing the UE acceleration to the third threshold may be, e.g., to distinguish the effects of a cryogenic attack on the memory from the effects of a system reboot or shutdown on the memory. If the UE acceleration exceeds the third threshold, indicating that the system is shutting down or rebooting, the method may start over at operation 702. If the UE acceleration does not exceed the third threshold, the cryo-attack detection unit may disable access to information on the DRAM at operation 712, and the process may end.

There are numerous ways to disable access to the information on the DRAM at operation 712. For example, in some embodiments, permanent destructive mechanisms such as blowing a fuse 612 which disables a power supply or voltage regulator output may be used to prevent access to the information. In other embodiments, upon detection of a cryo attack, the DRAM would be to blow a fuse 612 which disables the CMD decoder 614. When the CMD decoder 614 is disabled, all incoming commands would be ignored and the DRAM would not allow its data to be read.

In still other embodiments, the DRAM may write the entire array to a known state. A blanket write to all cells could be accomplished by using the refresh address counter to provide row addresses, cycling through all of them doing a special write cycle which forces all the sense amplifiers to a pre-determined state.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random-access memory (RAM), a read-only memory (ROM), an erasable programmable read-only memory (EPROM or Flash memory), a static random-access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer readable program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of exemplary embodiments of the various embodiments, reference was made to the accompanying drawings (where like numbers represent like elements), which form a part hereof, and in which is shown by way of illustration specific exemplary embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A dynamic random-access memory (DRAM) device having embedded error-correcting code (ECC), the DRAM device comprising:
    a DRAM array;
    a first register to store an error count;
    a first register bank to store a set of error addresses;
    a second register bank to store a plurality of decision parameters;

an ECC controller, wherein the ECC controller is configured to perform error detection using an ECC, increment the error count whenever an error is detected, and write an error address in an available register in the first register bank; and a failure detection unit to predict failure of the DRAM device and to detect failing rows or columns of the DRAM device.

2. The DRAM device of claim 1, further comprising a second register to store a multi-bit error count.

3. The DRAM device of claim 1, further comprising a second register to store an uncorrectable error flag.

4. A method for logging and correcting dynamic random-access memory (DRAM) errors, the method comprising:
   detecting an error in a word in a DRAM device using an error-correcting code;
   incrementing, in response to detecting the error, an error count stored in a first register;
   saving, in response to detecting the error, an error address corresponding to a location of the error in an available register in a first register bank;
   determining a first error count at a first time;
   determining a second error count at a second time, the second time being subsequent to the first time;
   determining a number of new errors by comparing the second error count to the first error count;
   determining whether the number of new errors is greater than a new error threshold; and
   scheduling, in response to determining that the number of new errors exceeds the new error threshold, a repair action.

5. The method of claim 4, further comprising:
   determining whether the error is uncorrectable; and
   setting, in response to the error being uncorrectable, an uncorrectable error flag.

6. A method for logging and correcting dynamic random-access memory (DRAM) errors, the method comprising:
   detecting an error in a word in a DRAM device using an error-correcting code;
   incrementing, in response to detecting the error, an error count stored in a first register;
   saving, in response to detecting the error, an error address corresponding to a location of the error in an available register in a first register bank;
   determining whether the error is in a first memory bank; and
   incrementing, in response to the error being detected in the first memory bank, a first bank-specific error count, wherein the first bank-specific error count stores a number of errors in the first memory bank and is stored in a second register bank.

7. A method for predicting failure in a DRAM device, the method comprising:
   receiving a memory information about the DRAM device;
   processing, using a set of decision parameters, the memory information to determine an error indicator;
   determining whether the error indicator exceeds an associated error threshold; and
   alerting, in response to the error indicator exceeding the associated error threshold, a controller, wherein alerting the controller comprises raising a dedicated pin.

8. The method of claim 7, wherein the error indicator is an error count.

9. The method of claim 7, wherein the error indicator is an error rate.

10. The method of claim 7, wherein the error indicator is an error acceleration.

11. A method for predicting failure in a DRAM device, the method comprising:
   receiving a memory information about the DRAM device;
   processing, using a set of decision parameters, the memory information to determine an error indicator;
   determining whether the error indicator exceeds an associated error threshold; and
   alerting, in response to the error indicator exceeding the associated error threshold, a controller, wherein alerting the controller comprises sending a predefined read data pattern to the controller.

* * * * *